(12) United States Patent
Xu et al.

(10) Patent No.: US 10,320,419 B2
(45) Date of Patent: Jun. 11, 2019

(54) ENCODING METHOD, DECODING METHOD, ENCODING DEVICE AND DECODING DEVICE FOR STRUCTURED LDPC

(71) Applicant: ZTE CORPORATION, Shenzhen, Guangdong Province (CN)

(72) Inventors: Jun Xu, Shenzhen (CN); Liguang Li, Shenzhen (CN); Zhifeng Yuan, Shenzhen (CN); Jin Xu, Shenzhen (CN); Kaibo Tian, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 15/120,126

(22) PCT Filed: Aug. 25, 2014

(86) PCT No.: PCT/CN2014/085132
§ 371 (c)(1),
(2) Date: Sep. 21, 2016

(87) PCT Pub. No.: WO2015/123979
PCT Pub. Date: Aug. 27, 2015

(65) Prior Publication Data
US 2017/0230058 A1     Aug. 10, 2017

(30) Foreign Application Priority Data

Feb. 21, 2014  (CN) .......................... 2014 1 0061163

(51) Int. Cl.
*H03M 13/00*     (2006.01)
*H03M 13/11*     (2006.01)
*H03M 13/03*     (2006.01)

(52) U.S. Cl.
CPC ....... *H03M 13/116* (2013.01); *H03M 13/036* (2013.01); *H03M 13/114* (2013.01);
(Continued)

(58) Field of Classification Search
CPC ............. H03M 13/116; H03M 13/118; H03M 13/616; H03M 13/6502
See application file for complete search history.

(56) References Cited

U.S. PATENT DOCUMENTS 7,774,675 B1 * 8/2010 Matache .............. H03M 13/116
                                                        370/206
8,028,216 B1 * 9/2011 Yeo ........................ H03M 5/145
                                                        714/755

(Continued)

FOREIGN PATENT DOCUMENTS

CN      101217337 A      7/2008
CN      101325474 A      12/2008
(Continued)

OTHER PUBLICATIONS

Xiangming Li, M. R. Soleymani, J. Lodge and P. S. Guinand, "Good LDPC codes over GF(q) for bandwidth efficient transmission," 2003 4th IEEE Workshop on Signal Processing Advances in Wireless Communications—SPAWC 2003 (IEEE Cat. No. 03EX689), 2003, pp. 95-99.*

(Continued)

*Primary Examiner* — Cynthia Britt
(74) *Attorney, Agent, or Firm* — Ling Wu; Stephen Yang; Ling and Yang Intellectual Property (57) ABSTRACT

An encoding method, decoding method, encoding device and decoding device for structured LDPC codes. The method includes: determining a basic matrix used for encoding, which includes K0 up-and-down adjacent pairs; and according to the basic matrix and an expansion factor
(Continued)

corresponding to the basic matrix, performing an LDPC encoding operation of obtaining a codeword of Nb×z bits according to source data of (Nb−Mb)×z bits, herein z is the expansion factor, and z is a positive integer which is greater than or equal to 1. The provided technical solution is applicable to the encoding and decoding of the structured LDPC, thereby realizing the encoding and decoding of LDPC at the high pipeline speed.

9 Claims, 4 Drawing Sheets

(52) U.S. Cl.
CPC ...... *H03M 13/118* (2013.01); *H03M 13/1137* (2013.01); *H03M 13/616* (2013.01); *H03M 13/6502* (2013.01); *H03M 13/6566* (2013.01)

(56) References Cited

U.S. PATENT DOCUMENTS

| | | | |
|---|---|---|---|
| 2006/0064627 A1 | 3/2006 | Berens et al. | |
| 2008/0168324 A1* | 7/2008 | Xu | H03M 13/033 714/758 |
| 2009/0106625 A1* | 4/2009 | Jun | G11B 20/18 714/758 |
| 2009/0113256 A1 | 4/2009 | Radosavljevic et al. | |
| 2009/0282315 A1 | 11/2009 | Trachewsky et al. | |
| 2010/0192043 A1* | 7/2010 | Alrod | H03M 13/1111 714/763 |
| 2010/0318872 A1* | 12/2010 | Wang | H03M 13/1114 714/752 |
| 2012/0240001 A1 | 9/2012 | Abu-Surra et al. | |
| 2017/0033804 A1* | 2/2017 | Li | H03M 13/036 |

FOREIGN PATENT DOCUMENTS

| | | |
|---|---|---|
| CN | 103220005 A | 7/2013 |
| CN | 103236860 A | 8/2013 |
| EP | 2333962 A1 | 6/2011 |
| JP | 2008526086 A | 7/2008 |
| JP | 2009100423 A | 5/2009 |

OTHER PUBLICATIONS

L. Wang, X. Zhang, F. Yu, Y. Fu and Y. Wang, "QC-LDPC Codes with Girth Eight Based on Independent Row-Column Mapping Sequence," in IEEE Communications Letters, vol. 17, No. 11, pp. 2140-2143, Nov. 2013.*

L. Chen and Z. Wu, "A novel approach for construction of rate-compatible low-density parity-check codes," MILCOM 2009—2009 IEEE Military Communications Conference, Boston, MA, 2009, pp. 1-7.*

XP010882670A; Coset-Based Quasi-Cyclic LDPC Codes for Optimal Overlapped Message Passing Decoding; Dai, Yongmei, et al. Department of Electrical and Computer Engineering Lehigh University. USA. IEEE 2005.

XP017790280A; LDPC coding for OFDMA PHY; Jan. 27, 2005; Brian Classon et al. IEEE 802.16 Broadband Wireless Access Working Group.

XP031345880A; A Low-Power 1-Gbps Reconfigurable LDPC Decoder Decoder Design for Multiple 4G Wireless Standard; Yang Sun et al. Department of Electrical and Computer Engineering, Rice University. IEEE 2008.

LDPC Coding for 45GHz; Li, Liguang, ZTE Corp. et al. Jun. 30, 2014.

Yusuke Mori, University of Electro and Communications, Tokyo, et al., Research for a Design about LDPC Code—Flexible Design Method for LDPC Code, IEICE Technical Report, IT2006-76, ISEC2006-133, WBS2006-75(Mar. 2007).

* cited by examiner

ENCODING METHOD, DECODING METHOD, ENCODING DEVICE AND DECODING DEVICE FOR STRUCTURED LDPC

TECHNICAL FIELD

The present document relates to a digital communication system, and more particularly, to an encoding method, decoding method, encoding device and decoding device for structured LDPC.

BACKGROUND OF THE RELATED ART

Figure 1:
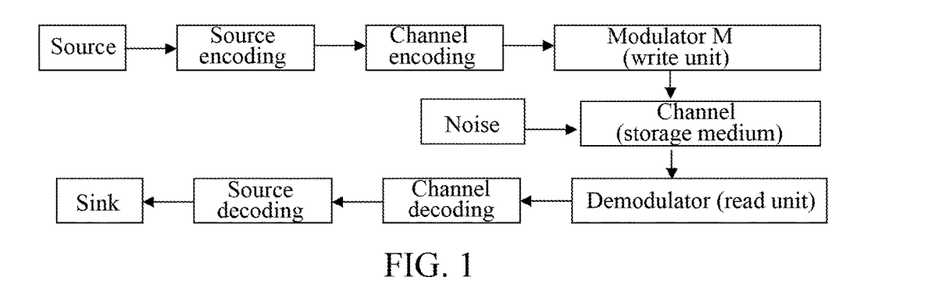
FIG. 1 is a module diagram of a digital communication system.

With development of wireless digital communication and emergence of various services with high speed and strong burst, there are increasingly higher demands for the error-correcting coding technology proposed by people. FIG. 1 shows a typical digital communication system. Low density parity check codes (LDPC) is a type of liner block code that can be defined by a very sparse parity check matrix or a bi-partite graph. The LDPC was initially discovered by Gallager, and that's why it is called Gallager codes. After decades of silence, with the development of computer hardware and the relative theories, MacKay and Neal rediscovered the LDPC and demonstrated that the LDPC has performance approaching the Shannon limit. The latest research shows that LDPC has the following advantages: low decoding complexity, being capable of linear-time coding, having performance approaching Shannon limit, being capable of parallel decoding, and superior to Turbo codes in the scenario of large-size codes.

LDPC codes are a type of linear block codes based on a sparse parity check matrix, and the encoding and decoding of low complexity are realized just by utilizing the sparsity of the check matrix of the LDPC codes, thereby making the LDPC codes practicable. Irregular codes refer to low density parity check codes where a row weight and a column weight of a parity check matrix are totally different, and column weights of an information bit portion of the parity check matrix are also different. Irregular codes refer to low density parity check codes where a row weight and a column weight of a parity check matrix are totally same, or low density parity check codes where a row weight and a column weight of an information-bit portion are totally same in a parity check matrix when a check-bit portion correspondingly maintains a constant structure. In the relevant literature, the low density parity codes of the second case of regular codes are named as semi-regular codes. Power number distribution of the basic matrix and power number distribution of the parity check matrix are consistent.

LDPC is a special type of linear block code. In communication, M check bits are needed to guarantee certain correction capability when a codeword with block length of N bits is sent, each codeword needs to meet $Hx^T=0^T$, herein H is an M×N dimensional parity check matrix in a binary field. All operations are performed in a binary field GF(2), and addition and subtraction herein are "XOR" operation, and multiplication is "AND" operation.

Structured LDPC

Structured LDPC codes, also named as (Quasi-Cyclic) QC-LDPC code, are a special kind of LDPC codes. Structured LDPC codes are very famous and have been adopted and widely used by many communication systems such as WiMAX, 11n, 11ad, 11ac etc. Meanwhile, it is very likely that Structured LDPC codes will be selected as main channel coding scheme for 5G (the 5-th mobile communication system)

A parity check matrix H of the structured LDPC codes is assumed to be an (Mb×z)×(Nb×z) matrix composed of Mb×Nb block matrices, each block matrix is a z×z basic permutation matrix with a different power number or a z×z zero matrix. When the basic permutation matrix is a unit matrix, block matrices are cyclic shift matrices of the unit matrix (the default is right shift in this document). Each block matrix can be uniquely identified via the power number j, the power number of the unit matrix can be represented as 0, and the power number of a matrix is generally represented as −1. Therefore, if each block matrix of H is replaced by its power number, an Mb×Nb power matrix Hb can be obtained. Here, Hb is defined as the basic matrix of H, and H is called the expand matrix of Hb. In practical encoding, $$z = \frac{\text{length of codeword}}{\text{column number } Nb \text{ of the basic matrix}},$$

and z is called the expand factor.

Structured LDPC codes, namely (Quasi-Cyclic)QC-LDPC codes, are defined by a base matrix Hb of size Mb×nb, an expanding factor (also named as a lift size) Z and a permutation matrix P of size Z×Z The size of information bits is K=kb×Z, kb=nb−Mb, the size of codeword is N=nb×Z, and the code rate is R=K/N. If each element $hb_{ij}$ in the base matrix Hb is replaced by zero sub-block matrix of size Z×Z or the sub-block matrix $P^{hb_{ij}}$, the parity check matrix H of QC-LDPC can be obtained. The base matrix Hb, parity check matrix H and the permutation matrix P are shown as follows:

$$Hb = \begin{bmatrix} hb_{00} & hb_{01} & \cdots & hb_{0(nb-1)} \\ hb_{10} & hb_{11} & \cdots & hb_{1(nb-1)} \\ \cdots & \cdots & \cdots & \cdots \\ hb_{(mb-1)0} & hb_{(mb-1)1} & \cdots & hb_{(mb-1)(nb-1)} \end{bmatrix}$$

$$H = \begin{bmatrix} P^{hb_{00}} & P^{hb_{01}} & \cdots & P^{hb_{0(nb-1)}} \\ P^{hb_{10}} & P^{hb_{11}} & \cdots & P^{hb_{1(nb-1)}} \\ \cdots & \cdots & \cdots & \cdots \\ P^{hb_{(mb-1)0}} & P^{hb_{(mb-1)1}} & \cdots & P^{hb_{(mb-1)(nb-1)}} \end{bmatrix}$$

$$P = \begin{bmatrix} 0 & 1 & 0 & \cdots & 0 \\ 0 & 0 & 1 & \cdots & 0 \\ \cdots & \cdots & \cdots & \cdots & \cdots \\ 0 & 0 & 0 & \cdots & 1 \\ 1 & 0 & 0 & \cdots & 0 \end{bmatrix}$$

Figure 3:
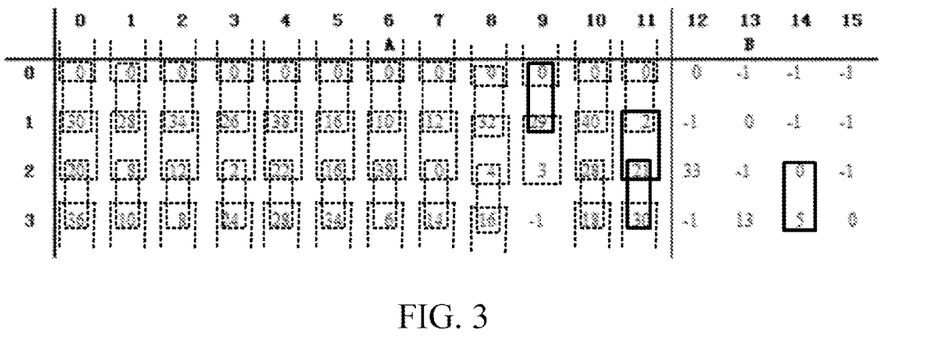
FIG. 3 is a schematic diagram of a basic matrix used in the first embodiment of the present document.

Wherein, if $hb_{ij}=-1$ in base matrix, $P^{hb_{ij}}$ in H equals a zero matrix of size Z×Z; otherwise, $P^{hb_{ij}}$ equals a permutation matrix P to $hb_{ij}$ power. The base matrix (Hb) can be divided into 2 parts: systematic part and parity part which are illustrated in FIG. 3. The systematic part includes kb columns (also known as systematic columns) and parity part includes Mb columns (also known as parity columns).

As a extended form, Structured LDPC codes also include multi-edge (ME) LDPC codes, which means that one entry of row i-th and column j-th in the base matrix may include one or two element instead of only one element. Herein, one element of row i-th and column j-th of base matrix means each element of the entry of row i-th and column j-th. By the way, two elements for row i-th and column j-th in the base matrix means that each sub-block matrix is composed by two overlapped circularly shifted matrices.

For example, matrix $$H = \begin{bmatrix} 1 & 0 & 0 & 0 & 1 & 0 & 1 & 0 & 0 & 0 & 0 & 0 \\ 0 & 1 & 0 & 0 & 0 & 1 & 0 & 1 & 0 & 0 & 0 & 0 \\ 0 & 0 & 1 & 1 & 0 & 0 & 0 & 0 & 1 & 0 & 0 & 0 \\ \hline 0 & 0 & 1 & 0 & 1 & 0 & 0 & 0 & 1 & 0 & 1 & 0 \\ 1 & 0 & 0 & 0 & 0 & 1 & 1 & 0 & 0 & 0 & 0 & 1 \\ 0 & 1 & 0 & 1 & 0 & 0 & 0 & 1 & 0 & 1 & 0 & 0 \end{bmatrix}$$

can be obtained by extending a 2×4 basic matrix Hb and the following parameter z:

$$Z = 3, \text{ and } H_b = \begin{bmatrix} 0 & 1 & 0 & -1 \\ 2 & 1 & 2 & 1 \end{bmatrix}$$

Therefore, an LDPC encoder of the present document can be uniquely generated by the basic matrix Hb, the expand factor z and the selected basic permutation matrix. In summary, each element in the basic matrix Hb corresponds to a z*z square matrix of the parity check matrix. In particular, in the basic matrix, each element taking the value of −1 corresponds to a z*z zero square matrix, and each element taking the value of non −1 corresponds to a z*z non-zero square matrix (i.e. the unit matrix or the cyclic shift matrices of the unit matrix). According to the above definition of the unit matrix, we can see that under the condition that an expand factor (an integer z greater than 1) is determined, and the base matrix and the parity check matrix are the same in nature.

Encoding of LDPC

A direct encoding method of system block codes is: a codeword x is divided into N−M information bits s and M check bits c, correspondingly, an M×N parity check matrix H is divided into two blocks with sizes of M×(N−M) and M×M corresponding to the information bits and the check bits respectively, namely H[A|B]. According to H×x=0, we can have:

$$[A \mid B] \times \begin{bmatrix} s \\ c \end{bmatrix} = 0$$

Then we can have A×s+B×c=0, and further derive c=B⁻¹As. When block B uses a special matrix structure, such as strictly lower triangular structure (half random matrix), double lower triangular structure, etc., B⁻¹ has a very simple form, the check bit part c in the codewords may be directly calculated according to the above formula, and the encoder can be guaranteed to have linear complexity.

Richarson linear-time encoding algorithm may also be applied, the parity check matrix H has quasi lower triangular structure, supposed that H has the following form:

$$H = \begin{pmatrix} A & B & T \\ C & D & E \end{pmatrix}$$

The encoded codewords are supposed to be x=(s, $p_1$, $p_2$), herein s is the system bit part of the encoded codewords, $p_1$ and $p_2$ are the check bit part of the codewords, the length of $p_1$ is g and the length of $p_2$ is (m−g). In the above formula, the dimensions of A are (m−g)×(n−m), the dimensions of B are (m−g)×g, the dimensions of T are (m−g)×(m−g), the dimensions of C are g×(n−m), the dimensions of D are g×g, and the dimensions of E are g×(m−g). All these matrices are sparse matrices, and T is a lower triangular matrix of which all the diagonal elements are 1. The check bit part may be obtained from the following formula:

$$p_1^T = -\varphi^{-1} = (-ET^{-1}A + C)s^T$$

$$p_2^T = -T^{-1}(As^T + Bp_1^T) \text{ herein, } \varphi = -ET^{-1}B + D$$

Therefore, the encoder of LDPC codes designed by the present document can be uniquely generated by the LDPC parity check matrix H, which actually determines not only the performance of the LDPC code decoder but also the complexity, storage space and processing delay of the encoder and decoder of LDPC codes. So it is the most important to search for an appropriate parity check matrix structure of LDPC codes.

In a specific implementation, an encoding function for obtaining a codeword of N bits according to source data of N−M bits may be performed by calculating with the foregoing direct method, Richarson method or other methods. In fact, the encoder uses software or hardware to implement the multiplication and addition operations of the sparse matrix in the formula. For LDPC based on the unit matrix and cyclic shift matrix of the unit matrix, the multiplication operation of the sparse matrix may be constituted by several cyclic shift registers with z bits (z is the expand factor) and several adders with z bits, and the addition operation of the sparse matrix may be performed by the foregoing several adders with z bits, and the several cyclic shift registers with z bits and several adders with z bits constitute a LDPC encoder implemented by a hardware circuit.

Decoding of LDPC

A graph presentation of an LDPC parity check matrix is a bipartite graph. The bipartite graph is one-to-one correspondence with the check matrix, an M×N parity check matrix H defines the restriction for each codeword of N bits meeting M parity check sets. One bipartite graph includes N variable nodes and M parity check nodes. When the $m^{th}$ check relates to the $n^{th}$ bit, that is, an element Hm in the $m^{th}$ row and the $n^{th}$ column of the H, when n equals to 1, there will be a connecting line to connect the check node m and the variable node n. There is no connection between nodes of any same kind in the bipartite graph, and the number of edges in the bipartite graph equals to the number of non-zero elements in the check matrix.

The message passing decoding algorithm of LDPC, also called as belief-propagation (BP) algorithm, assumes that the variable nodes are independent with each other, yet the existence of the short circle inevitably breaks the assumption of the independence, which will obviously decrease the decoding performance. In fact, the longer the shortest circle of the bipartite graph corresponding to the LDPC parity check matrix is, that is, the larger the girth value is, the less the positive feedback information transmitted from the variable node to itself is, and the better the decoding performance is. There is a relationship between the girth of the check matrix H and the basic matrix Hb, and the related conclusions can be obtained by validation of mathematical reasoning and computer simulation.

Basic Matrix Correction

If a same basic matrix can not be used for each different expand factor, an LDPC decoder/encoder needs to store one basic matrix for every different code length, then a large number of basic matrices need to be stored when there are a plurality of code lengths, thus a huge storage space will be occupied or the hardware circuit will be complicate.

The correction uses the expand factor of other code length to correct the non-negative elements in the basic matrix Hb, and the corrected element value should be less than the value of the expand factor under the code length. The correction algorithm may be mod, scale+floor or scale+round, etc. Supposed that Pi, j is the non-negative element in the $i^{th}$ row and the $j^{th}$ column of the basic matrix, and P'i, j is the corrected elements, there is:

For a Mod Algorithm:

$$P'_{ij} \equiv P_{ij} \bmod \frac{n}{N}$$

For a Scale+Floor Algorithm:

$$P'_{ij} = \left[ P_{ij} \times \frac{n}{2304} \right]$$

For a Scale+Round Algorithm:

$$P'_{ij} = \text{Round}\left( P_{ij} \times \frac{n}{2304} \right)$$

herein N is the number of columns of the basic matrix, and n is the code length of the low density parity check codes which will generate the parity check matrix. Mod is a mod operation, [ ] is a floor operation, and Round is a rounding operation. Here, the biggest length of codes is supposed to be 2304.

For example, for low density parity check codes with a code length of 1152 bits, supposed that some non-negative element of the basic matrix is 93, then the corrected result is:

For a Mod Algorithm:

$$93 \bmod \frac{1152}{24} = 93 \bmod 48 = 45$$

For a Scale+Floor Algorithm:

$$\left[ 93 \times \frac{1152}{2304} \right] = [46.5] = 46$$

For a Scale+Round Algorithm:

$$\text{Round}\left( 93 \times \frac{1152}{2304} \right) = \text{Round}(46.5) = 47$$

If the most recently popular layered decoding is used for LDPC, Read-write of log likelihood ratio information seriously affects the pipelined arrangement of LDPC. In particular, in the high bit rate, for an ordinary LDPC structure, the decoder needs to process one row of the base matrix before beginning the next stage of a pipeline, which needs a long waiting time, and if one stage of a pipeline is particularly long, the efficiency of the decoder will be seriously reduced.

SUMMARY

The embodiments of the present document provide an encoding method, decoding method, encoding device and decoding device for structured LDPC, which solves the existing problem of low efficiency of a decoder/encoder.

An encoding method for structured low density parity check codes (LDPC), including:
determining an Mb×Nb basic matrix used for encoding, herein the basic matrix includes an Mb×(Nb−Mb) block A corresponding to systematic bits and an Mb×Mb block B corresponding to check bits, the basic matrix includes K0 up-and-down adjacent pairs, the K0 up-and-down adjacent pairs include K1 up-and-down adjacent pairs of a first type and K2 up-and-down adjacent pairs of a second type, herein K0=K1+K2, and K0 is a positive integer greater than or equal to 6*Mb, K2 is a positive integer greater than or equal to 0 and less than or equal to 2*Mb, the up-and-down adjacent pairs are a set constituted by two elements $\{hb_{ij}, hb_{(i+1) \bmod Mb)j}\}$ in the basic matrix corresponding to non-zero square matrices,
up-and-down adjacent pairs of the first type are up-and-down adjacent pairs that are congruential with $(hb_{ij}-hb_{((i+1) \bmod Mb)j}) \bmod Q=a$, and
up-and-down adjacent pairs of the second type are up-and-down adjacent pairs that are congruential with $(hb_{ij}-hb_{((i+1) \bmod Mb)j}) \bmod Q=b$,
herein, $hb_{ij}$ represents an element in an $i^{th}$ row and $j^{th}$ column of the basic matrix, herein a and b are not equal, a and b are integers greater than or equal to 0 and less than or equal to Q−1, Q is a multiplication factor of an expansion factor z, i is a row index of the basic matrix, j is a column index of the basic matrix, i=0, 1, . . . , Mb−1, j=0, 1, . . . , Nb−1; and
according to the basic matrix and the expansion factor z corresponding to the basic matrix, performing an LDPC encoding operation of obtaining a codeword of Nb×z bits based on source data of (Nb−Mb)×z bits, herein z is a positive integer greater than or equal to 1.
Preferably, if K2 is greater than or equal to 3, for any $x1^{th}$ row and $((x1+1) \bmod Mb)^{th}$ row, a number of adjacent pairs of the second type is at most 3, herein x1=0, 1, . . . , Mb−1.
Preferably, the method according to claim 1, herein a value of Q takes any one of the following:
2, 3, 4, 5, 6, 7 and 8.
Preferably, a total number of elements in a $j^{th}$ column of the basic matrix corresponding to the non-zero square matrices is $L_j$, a first element from top to bottom is 0, $L_j$ is a positive integer greater than or equal to 1, and j=0, 1, . . . , Nb−1.
Preferably, a value of K2 takes any one of the following:
1, 2, 3, 4, 5, 6, 7, 8, 9, 10, 11 and 12.
A decoding method for structured LDPC, including:
determining an Mb×Nb basic matrix used for decoding, wherein the basic matrix includes an Mb×(Nb−Mb) block A corresponding to systematic bits and an Mb×Mb block B corresponding to check bits, the basic matrix includes K0 up-and-down adjacent pairs, the K0 up-and-down adjacent pairs include K1 up-and-down adjacent pairs of a first type and K2 up-and-down adjacent pairs of a second type, herein K0=K1+K2, K0 is a positive integer greater than or equal to 6*Mb, K2 is a positive integer greater than or equal to 0 and less than or equal to three 2*Mb, the up-and-down adjacent pairs are a set constituted by two elements $\{hb_{ij}, hb_{((i+1) \bmod Mb)j}\}$ in the basic matrix corresponding to non-zero square matrices, up-and-down adjacent pairs of the first type are up-and-down adjacent pairs that are congruential with $(hb_{ij}-hb_{((i+1) \bmod Mb)j}) \bmod Q=a$, and up-and-down adjacent pairs of the second type are up-and-down adjacent pairs that are congruential with $(hb_{ij}-hb_{((i+1) \bmod Mb)j}) \bmod Q=b$, herein $hb_{ij}$ represents an element in an $i^{th}$ row and $j^{th}$ column of the basic matrix, herein a and b are not equal, a and b are integers greater than or equal to 0 and less than or equal to Q−1, Q is a multiplication factor of an expansion factor z corresponding to the basic matrix, i is a row index of the basic matrix, j is a column index of the basic matrix, i=0, 1, . . . , Mb−1, j=0, 1, . . . , Nb−1; and according to the basic matrix and a corresponding expansion factor z, performing an LDPC decoding operation of obtaining information data of (Nb−Mb)×z bits based on a codeword of Nb×z bits, herein z is a positive integer greater than or equal to 1.

Preferably, if K2 is greater than or equal to 3, for any $x1^{th}$ row and $((x1+1) \bmod Mb)^{th}$ row, a number of adjacent pairs of the second type is at most 3, herein x1=0, 1, . . . , Mb−1.

Preferably, a value of Q takes any one of the following: 2, 3, 4, 5, 6, 7 and 8.

Preferably, a total number of elements in a $j^{th}$ column of the basic matrix corresponding to the non-zero square matrices is $L_j$, a first element from top to bottom is 0, $L_j$ is a positive integer greater than or equal to 1, and j=0, 1, . . . , Nb−1.

Preferably, according to the basic matrix and a corresponding expansion factor z, performing an LDPC decoding operation of obtaining information data of (Nb−Mb)×z bits based on a codeword of Nb×z bits includes:

using a layered belief-propagation BP algorithm and a corrected min-sum algorithm to perform a row update on the basic matrix, which includes:

in an odd number iteration, in addition to updating extrinsic information corresponding to elements other than adjacent pairs of the second type, only updating extrinsic information corresponding to an element in each adjacent pair of the second type, in an even number iteration, in addition to updating extrinsic information corresponding to elements other than adjacent pairs of the second type, only updating extrinsic information corresponding to another element in each adjacent pair of the second type, herein the extrinsic information is from a check node to a variable node; and calculating a log-likelihood ratio for a codeword by using the extrinsic information, and performing a hard decision, and checking whether a result is correct, and if correct, then outputting a correct codeword, and if wrong, then continuing a processing of decoding.

An encoding device for structured LDPC codes, including:

a basic matrix storage module, configured to store at least an Mb×Nb basic matrix used for encoding, herein the basic matrix includes an Mb×(Nb−Mb) block A corresponding to systematic bits and an Mb×Mb block B corresponding to check bits, the basic matrix includes K0 up-and-down adjacent pairs, the K0 up-and-down adjacent pairs include K1 up-and-down adjacent pairs of a first type and K2 up-and-down adjacent pairs of a second type, herein K0=K1+K2, K0 is a positive integer greater than or equal to 6*Mb, K2 is a positive integer greater than or equal to 0 and less than or equal to 2*Mb, the up-and-down adjacent pairs are a set constituted by two elements $\{hb_{ij}, hb_{((i+1) \bmod Mb)j}\}$ in the basic matrix corresponding to non-zero square matrices, up-and-down adjacent pairs of the first type are up-and-down adjacent pairs that are congruential with $(hb_{ij}-hb_{((i+1) \bmod Mb)j}) \bmod Q=a$, and up-and-down adjacent pairs of the second type are up-and-down adjacent pairs that are congruential with $(hb_{ij}-hb_{((i+1) \bmod Mb)j}) \bmod Q=b$, herein $hb_{ij}$ represents an element in an $i^{th}$ row and $j^{th}$ column of the basic matrix, herein a and b are not equal, a and b are integers greater than or equal to 0 and less than or equal to Q−1, Q is a multiplication factor of an expansion factor z, i is a row index of the basic matrix, j is a column index of the basic matrix, i=0, 1, . . . , Mb−1 j=0, 1, . . . , Nb−1; and an encoding operation module, configured to determine the basic matrix and the expansion factor z corresponding to the basic matrix, and perform an LDPC encoding operation of obtaining a codeword of Nb×z bits based on source data of (Nb−Mb)×z bits, herein z is a positive integer greater than or equal to 1.

Preferably, if K2 is greater than or equal to 3, for any $x1^{th}$ row and $((x1+1) \bmod Mb)^{th}$ row, a number of adjacent pairs of the second type is at most 3, herein x1=0, 1, . . . , Mb−1.

Preferably, a value of Q takes any one of the following: 2, 3, 4, 5, 6, 7 and 8.

Preferably, a total number of elements in a $j^{th}$ column of the basic matrix corresponding to non-zero square matrices is Lj, a first element from top to bottom is 0, Lj is a positive integer greater than or equal to 1, and j=0, 1, . . . , Nb−1.

Preferably, a value of K2 takes any one of the following: 1, 2, 3, 4, 5, 6, 7, 8, 9, 10, 11 and 12.

A decoding device for structured low density parity check codes (LDPC), including:

a basic matrix storage module, configured to store at least an Mb×Nb basic matrix used for decoding, herein the basic matrix includes an Mb×(Nb−Mb) block A corresponding to systematic bits and an Mb×Mb block B corresponding to check bits, the basic matrix includes K0 up-and-down adjacent pairs, the K0 up-and-down adjacent pairs include K1 up-and-down adjacent pairs of a first type and K2 up-and-down adjacent pairs of a second type, herein K0=K1+K2, K0 is a positive integer greater than or equal to 6*Mb, K2 is a positive integer greater than or equal to 0 and less than or equal to 2*Mb, the up-and-down adjacent pairs are a set constituted by two elements $\{hb_{ij}, hb_{((i+1) \bmod Mb)j}\}$ in the basic matrix corresponding to non-zero square matrices, up-and-down adjacent pairs of the first type are up-and-down adjacent pairs that are congruential with $(hb_{ij}-hb_{((i+1) \bmod Mb)j}) \bmod Q=a$, and up-and-down adjacent pairs of the second type are up-and-down adjacent pairs that are congruential with according to $(hb_{ij}-hb_{((i+1) \bmod b)j}) \bmod Q=b$, herein $hb_{ij}$ represents an element in an $i^{th}$ row and $j^{th}$ column of the basic matrix, herein a and b are not equal, a and b are integers greater than or equal to 0 and less than or equal to Q−1, Q is a multiplication factor of an expansion factor z, i is a row index of the basic matrix, j is a column index of the basic matrix, i=0, 1, ..., Mb−1 j=0, 1, ..., Nb−1; and a decoding operation module, configured to determine the basic matrix and a corresponding expansion factor z, and perform an LDPC decoding operation of obtaining information data of (Nb−Mb)×z bits based on a codeword of Nb×z bits, herein z is a positive integer greater than or equal to 1.

Preferably, if K2 is greater than or equal to 3, for any $x1^{th}$ row and $((x1+1) \mod Mb)^{th}$ row, a number of adjacent pairs of the second type is at most 3, herein x1=0, 1, ..., Mb−1.

Preferably, a value of Q takes any one of the following: 2, 3, 4, 5, 6, 7 and 8.

Preferably, a total number of elements in the $j^{th}$ column of the basic matrix corresponding to non-zero square matrices is Lj, a first element from top to bottom is 0, Lj is a positive integer greater than or equal to 1, and j=0, 1, ..., Nb−1.

Preferably, the decoding operation module includes:
a row updating unit for the basic matrix, configured to: use a layered belief-propagation (BP) algorithm and a corrected min-sum algorithm to perform a row update on the basic matrix, which includes:
in an odd number iteration, in addition to updating extrinsic information corresponding to elements other than adjacent pairs of the second type, only updating extrinsic information corresponding to an element in each adjacent pair of the second type,
in an even number iteration, in addition to updating extrinsic information corresponding to elements other than adjacent pairs of the second type, only updating extrinsic information corresponding to another element in each adjacent pair of the second type,
herein the extrinsic information is from a check node to a variable node; and
a decoding decision unit, configured to calculate a log-likelihood ratio for a codeword by using the extrinsic information, and perform a hard decision, and check whether a result is correct, and if correct, then output a correct codeword, and if wrong, then continue a processing of decoding.

An embodiment of the present document further provides a computer program, including program instructions, which, when executed by an encoding device, enable the encoding device to implement the above encoding method.

An embodiment of the present document further provides a computer program, including program instructions, which, when executed by a decoding device, enable the decoding device to implement the above decoding method.

The embodiment of the present document further provides a carrier carrying any one of the above computer programs.

Embodiments of the present document provide an encoding method, decoding method, encoding device and decoding device for structured LDPC codes. By determining a basic matrix, used for decoding or encoding, which includes K0 up-and-down adjacent pairs, according to the basic matrix and the expansion factor corresponding to the basic matrix, the decoding or encoding is completed, LDPC encoding and decoding at the high pipeline speed are realized, and the existing problem of low efficiency of a decoder/encoder is solved.

PREFERRED EMBODIMENTS

For a conventional structured LDPC, if the most recently popular layered decoding is used, read-write of log likelihood ratio information seriously affects the pipelined arrangement of LDPC. In particular, in the high bit rate, for an ordinary LDPC structure, the decoder needs to process one row of the base matrix before beginning the next stage of a pipeline. The efficiency of the decoder will be seriously reduced if one stage of a pipeline is particularly long.

However, the number of possible combination patterns of basic matrices is huge, and in the existing art, there is no feasible method to reduce waiting time, and no basic matrix is obtained to satisfy such requirement.

In order to solve the above problem, the embodiments of the present document provide an encoding method, decoding method, encoding device and decoding device for structured LDPC. Based on practicability, for several different code lengths with the same bit rate, the embodiments of the present document use the same basic matrix which is usually generated corresponding to the longest code. At the same time, the basic matrix is corrected for different code lengths, which makes the generated decoder/encoder suitable for the case of variable code lengths. Not limited to this point, the present document also applies to the case that each code length uses a basic matrix.

Hereinafter, in conjunction with the accompanying drawings, the embodiments of the present document will be described in detail. It should be noted that in the case of no conflict, the embodiments in the present document and the features in the embodiments may be arbitrarily combined with each other.

Embodiment 1

Figure 2:
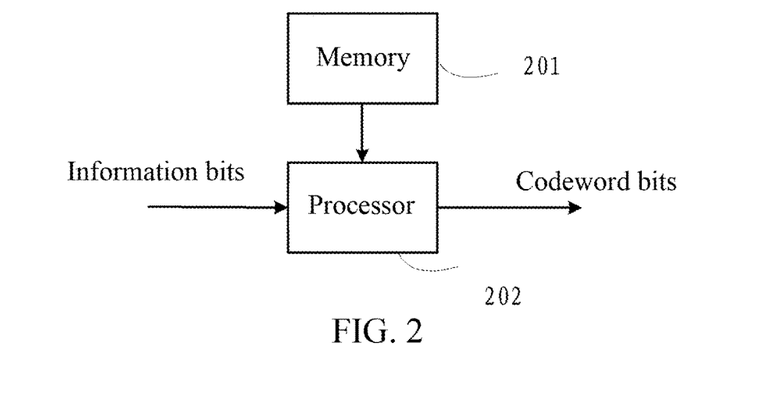
FIG. 2 is a schematic diagram of a structure of an encoder of LDPC codes provided in a first embodiment of the present document.

The embodiment of the present document provides an encoding device for structured low density parity check (LDPC) codes in digital communication, whose structure is shown in FIG. 2, at least including a processor 202 and a memory 201.

The memory 201 is configured to, at least, store a basic matrix which is used for encoding and includes K0 up-and-down adjacent pairs and parameters.

For each basic matrix $H_b$, if the number of different up-and-down adjacent pairs is K0, there are K1 up-and-down adjacent pairs of a first type and K2 up-and-down adjacent pairs of a second type, herein K0=K1+K2, K0 is a positive integer greater than or equal to 6*Mb, and K2 is a positive integer greater than or equal to 0 and less than or equal to 2*Mb.

Preferably, if K2 is greater than or equal to 3, for any two adjacent rows (the x1$^{th}$ row and the ((x1+1) mod Mb)$^{th}$ row), the number of adjacent pairs of the second type is at most 3, herein x1 and x2 take the value from 0 to Mb−1.

Herein, the up-and-down adjacent pair is defined as a set constituted by two elements $\{hb_{ij}, hb_{((i+1) \bmod Mb)j}\}$ corresponding to non-zero square matrices in each basic matrix $H_b$, that is, a set constituted by two adjacent elements corresponding to non-zero square matrices in some column of a basic matrix, herein the last row and the first row are defined as adjacent, and the last row is defined as a previous row of the first row. The up-and-down adjacent pairs of the first type are defined as up-and-down adjacent pairs that are congruential with $(hb_{ij}-hb_{((i+1) \bmod Mb)j})$ mod Q=a, and the up-and-down adjacent pairs of the second type are defined as up-and-down adjacent pairs that are congruential with $(hb_{ij}-hb_{((i+1) \bmod Mb)j})$ mod Q=b.

The total number of elements corresponding to the non-zero square matrices in the j$^{th}$ column of the basic matrix $H_b$ is 4, the first element from top to bottom is 0, $L_j$ is a positive integer greater than or equal to 1, and j=0, 1, ..., Nb−1. It needs to be noted that the present document is not limited to such manner. The last element may also be 0, or any element may also be 0. By these manners it is ensured that if the layered decoding is used, a cyclic shift inverse network may not be used, a routing overhead may be greatly reduced, and a beneficial effect is obtained.

The processor 202 is configured to determine the basic matrix and an expansion factor z, and perform an LDPC encoding operation of obtaining a codeword of Nb×z bits according to source data of (Nb−Mb)×z bits.

Herein, $hb_{ij}$ represents an element in the i$^{th}$ row and j$^{th}$ column of one basic matrix, herein, a and b are not equal, a and b are integers greater than or equal to 0 and less than or equal to Q−1, Q is a multiplication factor of the expansion factor z, column weight of the j$^{th}$ column refers to the total number of elements corresponding to non-zero square matrices in the j$^{th}$ column of the $H_b$, i is a row index of the $H_b$, j is a column index of the $H_b$, i=0, 1, ..., Mb−1, j=0, 1, ..., Nb−1 z is the expansion factor, and z is a positive integer greater than or equal to 1.

Preferably, the value of K2 typically takes any of the following: 1, 2, 3, ..., and 12.

Preferably, the value of Q typically takes any of the following: 2, 3, 4, 5, 6, 7 and 8.

The following describes a more specific embodiment. A basic matrix $H_b$, as shown in FIG. 3, meets the above requirements.

For the basic matrix shown in FIG. 3, parameters are set, such as, the bit rate corresponding to matrix is ¾, the number of rows of the matrix is Mb=4, the number of columns of the matrix is Nb=16, Q=2, K2=4, K0=47, K1=43, a=0, b=1. The basic matrix corresponds to the expansion factor z=42. The expansion factor z=42=2*3*7, therefore Q=2 satisfies the requirement that the Q is the multiplication factor of the expansion factor z.

For the basic matrix $H_b$ shown in FIG. 3, if the number of different up-and-down adjacent pairs is K0=47, there are K1=43 up-and-down adjacent pairs of the first type and K2=3 up-and-down adjacent pairs of the second type. The following are apparently satisfied: K0=K1+K2, K0 is a positive integer greater than 24, and K2 is a positive integer greater than 8.

Herein, up-and-down adjacent pairs of the first type are defined as up-and-down adjacent pairs with $(hb_{ij}-hb_{((i+1) \bmod Mb)j})$ mod Q=0, as shown by a dotted box in FIG. 3, herein an uppermost half dotted box and a lowermost half dotted box of one column constitute a full dotted box. The up-and-down adjacent pairs of the second type are defined as up-and-down adjacent pairs with $(hb_{ij}-hb_{((i+1) \bmod Mb)j})$ mod 2=1, as shown by a solid box in FIG. 3.

In the above given matrix, the uppermost are column indexes, the leftmost are row indexes, the part A of the matrix is a systematic bit part of the matrix, the part B is a check bit part of the matrix. Elements, taking the value of −1 in the matrix, correspond to full-zero square matrices of z×z. Elements, taking the value of non −1, correspond to non-zero square matrices of z×z, and the non-zero square matrices are matrices obtained by cyclic-shifting the unit matrix by the corresponding value.

According to the described features, the up-and-down adjacent pairs are a set constituted by two adjacent elements, corresponding to non-zero square matrices, in some column of a basic matrix, specifically as the 2 elements shown in the rectangular box in the figure. The dotted box represents up-and-down adjacent pairs of the first type, and correspondingly a=0. The solid box represents up-and-down adjacent pairs of the second type, and correspondingly b=1.

It can be seen that there are 4 up-and-down adjacent pairs of the second type. In the above basic parity matrix, for two adjacent rows, there are no more than 2 up-and-down adjacent pairs of the second type. For example, for the 0$^{th}$ and 1$^{st}$ rows, there is only one up-and-down adjacent pair of the second type; for the 1$^{st}$ and 2$^{nd}$ rows, there is only one up-and-down adjacent pair of the second type; for the 2$^{nd}$ and 3$^{rd}$ rows, there are two up-and-down adjacent pairs of the second type; for the 3$^{rd}$ and 0$^{th}$ rows, there is no up-and-down adjacent pair of the second type.

In addition, the first element corresponding to a non-zero square matrix in each the columns of the basic matrix Hb is 0. In this case, the cyclic shift network only needs to complete cyclic shift differences. For example, for the first column, the cyclic shift network only needs to implement shifts of 30-0, 20-30, 36-20, and 0-36. After a full LDPC iteration is completed, information of a log-likelihood ratio corresponding to the first basic matrix is returned to a sequential position, and a hard decision can be performed, and if correct, then it is to output, and if wrong, the iteration is continued. In this case, a LDPC layered decoder with the matrix structure of the embodiment of the present document, does not need the cyclic shift inverse network. Compared with conventional solutions, the routing is halved.

Preferably, the encoder also has the following features: the encoder further includes an expansion module, configured to perform an expansion on the basic matrix according to the expand factor and a basic permutation matrix to obtain a parity check matrix of the (M×z)×(N×z) low density parity check codes. The decoding operation module performs an encoding operation based on the parity check matrix obtained by the expand of the basic matrix.

In the embodiment of the present document, an LDPC encoding is performed on an information bit through a proposed structure of the basic matrix, which may generate an LDPC codeword. This LDPC codeword is sent to a channel via modules of modulation and so on. After receiving a signal, a receiving end performs processing such as demodulation and so on, and generates a received LDPC codeword. The received LDPC codeword is sent to an LDPC decoder. By such LDPC codeword, it is ensured that the pipeline speed of the decoding achieves the effect of being raised, that is, the processing speed of the decoder achieves the effect of being raised. This effectively increases the efficiency of LDPC, and accelerates the decoding speed. By allowing to not use the inverse cyclic shift network (for writing a memory), the structure of the basic matrix proposed by the embodiment of the present document can also reduce switching networks, and further reduces complexity of hardware.

Embodiment 2

Figure 4:
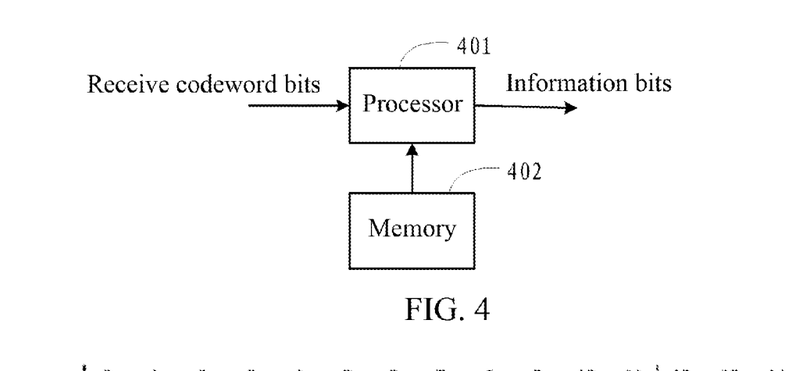
FIG. 4 is a schematic diagram of a structure of a decoder of LDPC codes provided in a second embodiment of the present document.

The embodiment of the present document provides a decoding device for structured low density parity check (LDPC) codes in digital communication, whose structure is shown in FIG. 4, at least including a processor 402 and a memory 401.

The memory 401 is configured to, at least, store a basic matrix including K0 up-and-down adjacent pairs and parameters. The basic matrix includes the following features:

For each basic matrix $H_b$, if the number of different up-and-down adjacent pairs is K0, there are K1 up-and-down adjacent pairs of a first type and K2 up-and-down adjacent pairs of a second type, herein K0=K1+K2, K0 is a positive integer greater than or equal to 6*Mb, and K2 is a positive integer greater than or equal to 1 and less than or equal to 2*Mb.

Preferably, if K2 is greater than or equal to 3, for any two adjacent rows (the $x1^{th}$ row and the $((x1+1) \bmod Mb)^{th}$ row), the number of adjacent pairs of the second type is at most 3, herein x1 and x2 take the value from 0 to Mb−1.

The up-and-down adjacent pair is defined as a set constituted by two elements $\{hb_{ij}, hb_{((i+1) \bmod Mb)j}\}$ corresponding to non-zero square matrices in each basic matrix $H_b$, that is, a set constituted by two adjacent elements corresponding to non-zero square matrices in some column of a basic matrix, herein the last row and the first row are defined as adjacent rows, and the last row is defined as a previous row of the first row. The up-and-down adjacent pairs of the first type are defined as up-and-down adjacent pairs that are congruential with $(hb_{ij}-hb_{((i+1) \bmod Mb)j}) \bmod Q=a$, and up-and-down adjacent pairs of the second type are defined as up-and-down adjacent pairs that are congruential with $(hb_{ij}-hb_{((i+1) \bmod Mb)j}) \bmod Q=b$.

The total number of elements corresponding to the non-zero square matrices in the $j^{th}$ column of the basic matrix $H_b$ is 4, the first element from top to bottom is 0, $L_j$ is a positive integer greater than or equal to 1, and j=0, 1, . . . , Nb−1.

The processor 402 is configured to, according to the basic matrix and the corresponding expansion factor z, perform an LDPC decoding operation of obtaining the information data of (Nb−Mb)×z bits according to the codeword of Nb×z bits.

Herein, $hb_{ij}$ represents an element in the $i^{th}$ row and $j^{th}$ column of one basic matrix, herein, a and b are not equal, a and b are integers between 0 and Q−1, Q is a multiplication factor of the expansion factor z. Column weight of the $j^{th}$ column refers to the total number of elements corresponding to non-zero square matrices in the $j^{th}$ column of the $H_b$. i is a row index of the $H_b$, j is a column index of the $H_b$, i=0, 1, . . . , Mb−1, j=0, 1, . . . , Nb−1, z is the expansion factor, and z is a positive integer greater than or equal to 1.

Preferably, the value of K2 typically takes one of the following: 1, 2, 3, . . . , and 12.

Preferably, the value of Q typically takes one of the following: 2, 3, 4, 5, 6, 7 and 8.

The following describes a more specific embodiment. A basic matrix $H_b$, as shown in FIG. 5, meets the above requirement.

Figure 5:
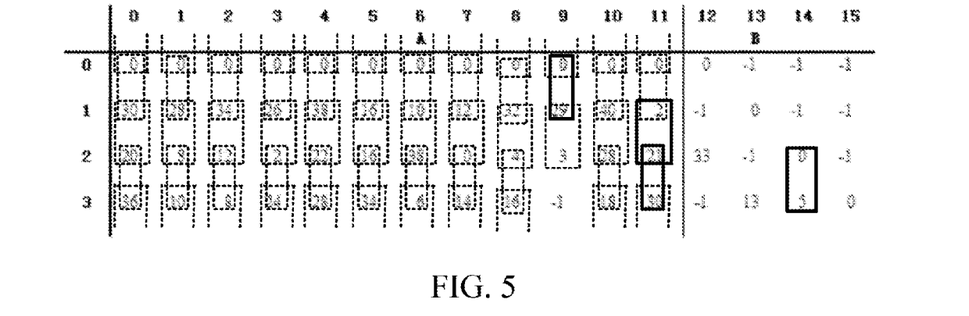
FIG. 5 is a schematic diagram of a basic matrix used in the second embodiment of the present document.
Figure 6:
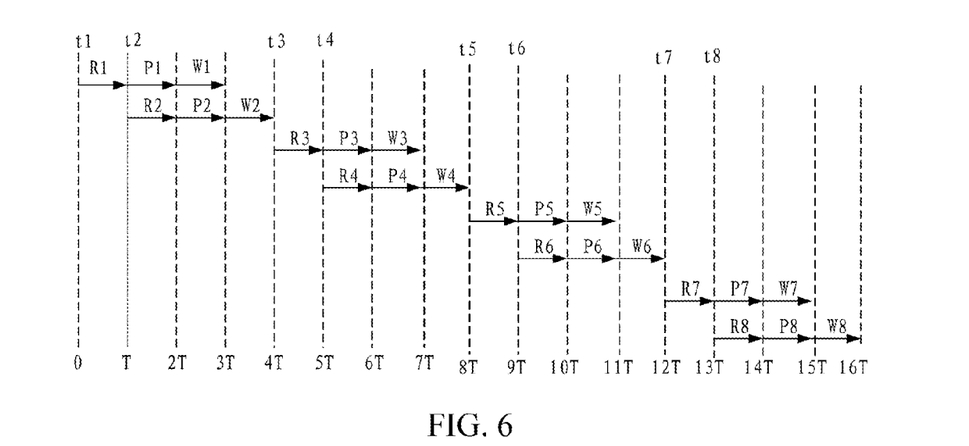
FIG. 6 is a schematic diagram of a conventional layered decoding pipeline provided in the second embodiment of the present document.
Figure 7:
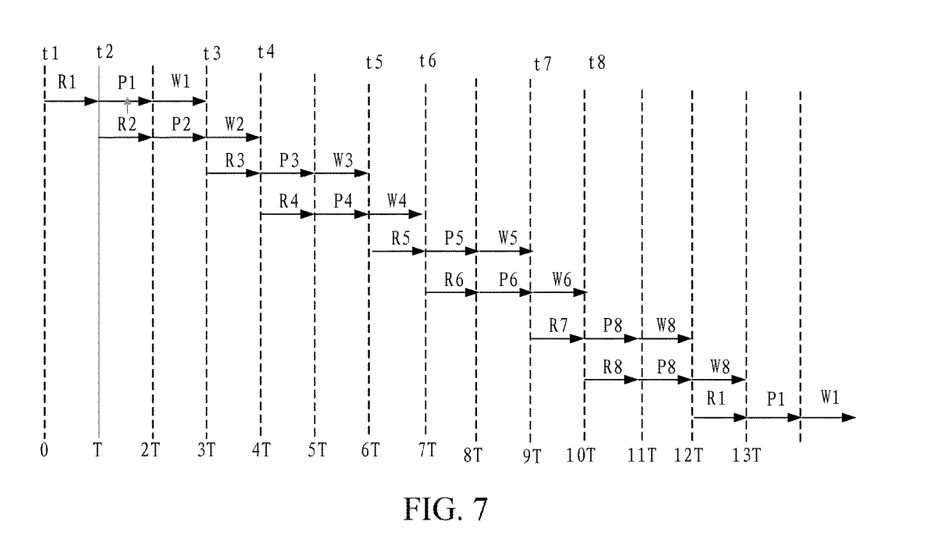
FIG. 7 is a schematic diagram of a layered decoding pipeline of the present document provided in the second embodiment of the present document.

For the basic matrix shown in FIG. 5, parameters are set, such as, the bit rate corresponding to the matrix is ¾, the number of rows of the matrix is Mb=4, the number of columns of the matrix is Nb=16, Q=2, K2=4, K0=47, K1=43, a=0, b=1. The basic matrix corresponds to the expansion factor z=42. For the expansion factor z=42=2*3*7, therefore Q=2 satisfies the requirement that Q is the multiplication factor of the expansion factor z.

For the basic matrix $H_b$ shown in FIG. 5, if the number of different up-and-down adjacent pairs is K0=47, there are K1=43 up-and-down adjacent pairs of the first type and K2=3 up-and-down adjacent pairs of the second type. The following are apparently satisfied: K0=K1+K2, K0 is a positive integer greater than 24, and K2 is a positive integer greater than 8.

Herein, up-and-down adjacent pairs of the first type are defined as up-and-down adjacent pairs that are $(hb_{ij}-hb_{((i+1) \bmod Mb)j}) \bmod Q=0$, as shown by a dotted box in the figure where an uppermost half dotted box and a lowermost half dotted box of one column constitute a full dotted box. The up-and-down adjacent pairs of the second type are defined as up-and-down adjacent pairs that are $(hb_{ij}-hb_{((i+1) \bmod Mb)j}) \bmod 2=1$, as shown by a solid box in FIG. 5.

In the above given matrix, the uppermost are column indexes, the leftmost are row indexes, the part A of the matrix is a systematic bit part of the matrix, the part B is a check bit part of the matrix. Elements, taking the value of −1 in the matrix, correspond to full-zero square matrices of z×z. Elements, taking the value of non −1, correspond to non-zero square matrices of z×z, and the non-zero matrices are matrices obtained by cyclic-shifting the unit matrix by the corresponding value.

According to the described features, the up-and-down adjacent pairs are a set constituted by two adjacent elements corresponding to non-zero square matrices in some column of a basic matrix, specifically as 2 elements shown in the rectangular box in FIG. 5. The dotted box represents up-and-down adjacent pairs of the first type, and correspondingly a=0. The solid box represents up-and-down adjacent pairs of the second type, and correspondingly b=1.

It may be seen that there are 4 up-and-down adjacent pairs of the second type. In the above basic parity matrix, for two adjacent rows, there are no more than 2 up-and-down adjacent pairs of the second type. For example, for the $0^{th}$ and $1^{st}$ rows, there is only one up-and-down adjacent pair of the second type; for the $1^{st}$ and $2^{nd}$ rows, there is only one up-and-down adjacent pair of the second type; for the $2^{nd}$ and $3^{rd}$ rows, there are two up-and-down adjacent pairs of the second type; for the $3^{rd}$ and $0^{th}$ rows, there is no up-and-down adjacent pair of the second type.

In addition, the first element corresponding to a non-zero square matrix in each the columns of the basic matrix Hb is 0. In this case, the cyclic shift network only needs to complete cyclic shift differences. For example, for the first column, the cyclic shift network only needs to implement shifts of 30-0, 20-30, 36-20, and 0-36. After a full LDPC iteration is completed, information of a log-likelihood ratio corresponding to the first basic matrix is returned to a sequential position, and a hard decision can be performed, and if correct, then it is to output, and if wrong, the iteration is continued. In this case, a LDPC layered decoder with the matrix structure of the embodiment of the present document, does not require the cyclic shift inverse network. Compared with conventional solutions, the routing is halved. Further, the processor uses a layered belief-propagation (BP) algorithm and a corrected min-sum algorithm for decoding to perform a row update on the basic matrix. In an odd number iteration, in addition to updating extrinsic information corresponding to an element other than adjacent pairs of the second type, the processor only updates extrinsic information (check node to variable node information) corresponding to one element in each adjacent pair of the second type. In an even number iteration, in addition to updating extrinsic information corresponding to elements other than adjacent pairs of the second type, the processor only updates extrinsic information (check node to variable node information) corresponding to another element in each adjacent pair of the second type.

The following illustrates beneficial effects of the decoding which are caused by the code structure of the present embodiment of the invention.

If the parallelism degree of the decoder is parallel=21, and for a codeword bit sequence, there is one log likelihood ratio (LLR) memory for each zf=42 bits, then there are 16 LLR memories, and each memory corresponds to a column of one basic matrix. Each LLR memory includes wordnum=zf/parallel=2 words, one word stores odd bits among 42 bits corresponding to one column of the basic matrix, and another word stores even bits. Herein, Zf is the expansion factor.

During the decoding of the decoder, for each layer layernum (from 0 to the maximum level allowed by the decoding), 21 rows of the parity check matrix H are selected and updated according to the following formula:

rowind=Rowind$Hb$*zf+mod(layernummod,wordnum):wordnum:(Rowind$Hb$+1)*zf−1;

herein, layernummod=mod(layernum,Totallayers), Rowind$Hb$=fix(layernummod*parallel/zf); Totallayers=$Mb$*zf/parallel=8.

At a first time t0, the layered decoder performs a row update on rows 0, 2, . . . , and 40, and completes the layered decoding of the first layer; at a second time t1, the decoder performs a row update on rows 1, 3, . . . , and 41, and completes the layered decoding of the second layer; at a third time t2, the decoder performs a row update on rows 42, 44, . . . , and 82, and completes the layered decoding of the third layer; at a fourth time t3, the decoder performs a row update on rows 43, 45, . . . , and 83, and completes the layered decoding of the fourth layer; at a fifth time t4, the decoder performs a row update on rows 84, 86, . . . , and 124, and completes the layered decoding of the fifth layer; at a sixth time t5, the decoder performs a row update on rows 85, 87, . . . , and 125, and completes the layered decoding of the sixth layer; at a seventh time t6, the decoder performs a row update on rows 126, 128, . . . , and 166, and completes the layered decoding of the seventh layer; at an eighth time t7, the decoder performs a row update on rows 127, 129, . . . , and 167, and completes the layered decoding of the eighth layer. A full decoding of LDPC codes is therefore completed. If there is no convergence, the above process is continued to be repeated until the decoding succeeds or until the decoding fails and reaches the maximum allowable number.

Figure 10:
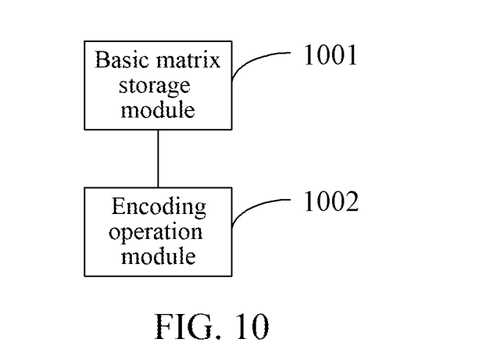
FIG. 10 is a schematic diagram of a structure of an encoding device for structured LDPC codes provided in a fifth embodiment of the present document and FIG. 11 is a schematic diagram of a structure of a decoding device for structured LDPC codes provided in the fifth embodiment of the present document.

For a conventional decoder, it is required to wait for the decoding pipeline of the second layer being fully implemented before starting the layered decoding of the third layer, there is a long waiting time. Similarly, it is required to wait for the decoding pipeline of the fourth layer being fully implemented before starting the layered decoding of the fifth layer, there is a long waiting time. Similarly, it is required to wait for the decoding pipeline of the sixth layer being fully implemented before starting the layered decoding of the seventh layer, there is a long waiting time. Similarly, it is required to wait for the decoding pipeline of the sixth layer being fully implemented before starting the layered decoding of the seventh layer, there is a long waiting time. By analogy, the waiting time generates a great delay on the LDPC pipeline, which greatly reduces the speed of the decoding of the layered LDPC codes. As shown in FIG. 10, supposing that, for each layer LDPC, one clock is used for reading, one clock for processing, and one clock for writing, and each clock occupies a time of T, then a full LDPC decoding needs a time of 16*T.

Figure 11:
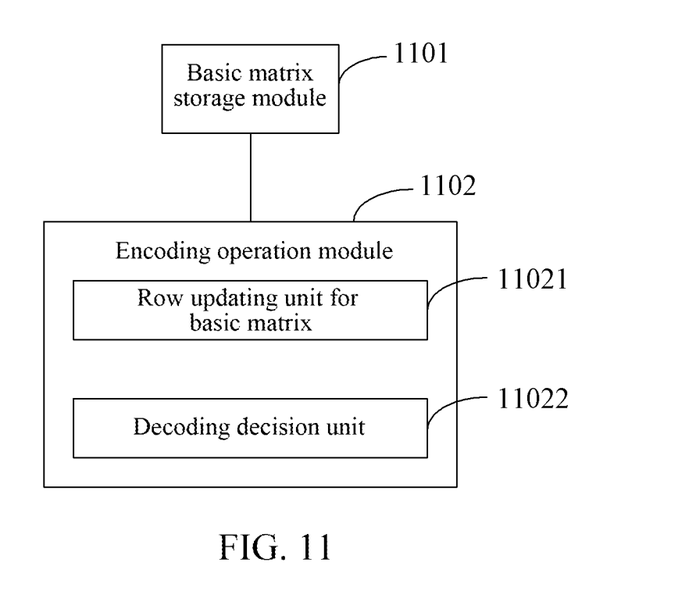

Since our design avoids that the word used in a last pipeline must be different from the word used in a next pipeline when crossing layers. Further, a time-sharing processing is used for a small amount of collision. As shown in FIG. 11, only a time of 13*T is needed. In fact, as a whole, a time of 4*T can be saved for the time of every 16*T during LDPC decoding.

In the embodiment of the present document, the parallelism degree can be selected to be 7, and there are 6 words. If odd words are processed first and even words are processed later, arrangement similar to that in FIG. 4 and FIG. 5 is performed. As a whole, LDPC needs a time of 32*T, and by using the decoding of the present document, a time of 12*T can be saved. The effect is more obvious.

In the embodiment of the present document, the parallelism degree can be expanded to 42, simultaneous decoding can be performed on rows 0, 2, . . . , 40, and rows 42, 44, . . . , 82, since these rows require data with the same address. In addition, the pipeline can further be arranged, which is not a simple layered decoding algorithm, but saves time more obviously.

In the embodiment of the present document the parallelism degree can be expanded to 84, simultaneous decoding can be performed on rows 0, 2, . . . , 40, rows 42, 44, . . . , 82, rows 84, 86, . . . , 124, and rows 126, 128, . . . , 166, since these rows require data with the same address. In addition, the pipeline can be further arranged, which is not a simple layered decoding algorithm, but saves time more obviously.

Therefore, the structure in the embodiment of the present document can support a very high or relatively flexible parallelism which satisfies the decoding requirement of a super high speed, thereby reaching Gbps decoding speed. In the embodiment, by using the proposed structure of the basic matrix, LDPC decoding is performed on the information bits, and the LDPC decoder receives the LDPC codeword. Thus, LDPC decoder can ensure that the effect is got that the pipeline speed of the decoding is raised, that is, the effect is got that processing speed of the decoder is raised. The efficiency of LDPC codes is effectively increased, and the decoding speed is accelerated. By allowing to not use the inverse cyclic shift network (for writing a memory), the structure of the basic matrix proposed by the embodiment of the present document can also reduce switching networks, and likewise further reduce complexity of hardware.

Embodiment 3

Figure 8:
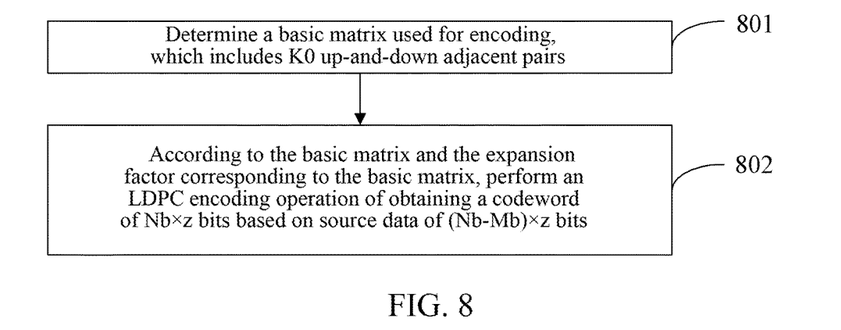
FIG. 8 is a flow chart of an encoding method for structured LDPC codes provided in a third embodiment of the present document.

The embodiment of the present document provides an encoding method for structured LDPC codes, and the process of LDPC encoding which is completed by using the encoding method, is as shown in FIG. 8. The method includes the following steps.

In step 801, it is to determine a basic matrix used for encoding, which includes K0 up-and-down adjacent pairs.

In this step, the basic matrix includes an Mb×(Nb−Mb) block A corresponding to systematic bits and an Mb×Mb block B corresponding to check bits. The basic matrix includes K1 up-and-down adjacent pairs of a first type and K2 up-and-down adjacent pairs of a second type, herein K0=K1+K2, K0 is a positive integer greater than or equal to 6*Mb, K2 is a positive integer greater than or equal to 0 and less than or equal to 2*Mb. The up-and-down adjacent pairs are a set constituted by two elements $\{hb_{ij}, hb_{((i+1)\ mod\ Mb)j}\}$ corresponding to non-zero square matrices in each basic matrix.

The up-and-down adjacent pairs of the first type are up-and-down adjacent pairs that are congruential with $(hb_{ij}-hb_{((i+1)\ mod\ Mb)j})$ mod Q=a.

The up-and-down adjacent pairs of the second type are up-and-down adjacent pairs that are congruential with $(hb_{ij}-hb_{((i+1)mod\ Mb)j})$ mod Q=b.

Herein, $hb_{ij}$ represents an element in the $i^{th}$ row and $j^{th}$ column of the basic matrix, herein, a and b are not equal, a and b are integers greater than or equal to 0 and less than or equal to Q−1, Q is a multiplication factor of an expansion factor z, a column weight of the $j^{th}$ column refers to the total number of elements corresponding to non-zero square matrices in the $j^{th}$ column of the basic matrix, i is a row index of the basic matrix, j is a column index of the basic matrix, i=0, 1, . . . , Mb−1 j=0, 1, . . . , Nb−1.

If K2 is greater than or equal to 3, for any two adjacent rows (the $x1^{th}$ row and the $((x1+1)\ mod\ Mb)^{th}$ row), the number of adjacent pairs of the second type is at most 3, herein row index x1 takes the value from 0 to Mb−1.

the value of Q takes any of the following:
2, 3, 4, 5, 6, 7 and 8.

The total number of elements corresponding to the non-zero square matrices in the $j^{th}$ column of the basic matrix is 4, the first element from top to bottom is 0, $L_j$ is a positive integer greater than or equal to 1, and j=0, 1, . . . , Nb−1.

The value of K2 takes any of the following:
1, 2, 3, 4, 5, 6, 7, 8, 9, 10, 11 and 12.

In step 802, according to the basic matrix and the expansion factor corresponding to the basic matrix, an LDPC encoding operation of obtaining a codeword of Nb×z bits according to source data of (Nb−Mb)×z bits is performed.

Herein, z is the expansion factor, and z is a positive integer greater than or equal to 1.

Embodiment 4

Figure 9:
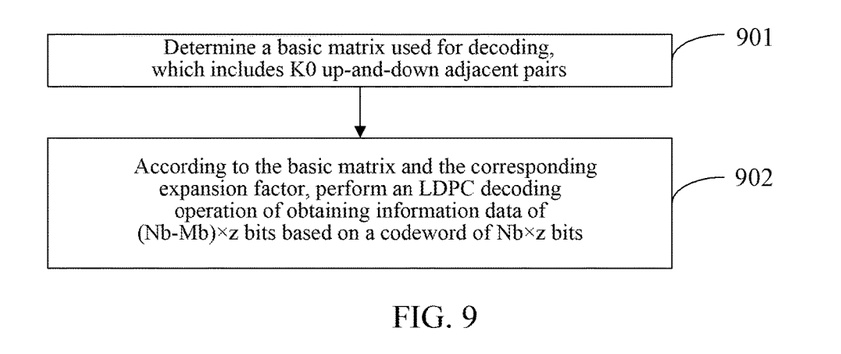
FIG. 9 is a flow chart of a decoding method for structured LDPC codes provided in a fourth embodiment of the present document.

The embodiment of the present document provides an encoding method for structured LDPC codes, and the process of LDPC encoding which is completed by using the encoding method, is as shown in FIG. 9. The method includes the following steps.

In step 901, it is to determine a basic matrix used for decoding, which includes K0 up-and-down adjacent pairs.

The basic matrix includes an Mb×(Nb−Mb) block A corresponding to systematic bits and an Mb×Mb block B corresponding to check bits. The basic matrix includes K1 up-and-down adjacent pairs of a first type and K2 up-and-down adjacent pairs of a second type, herein K0=K1+K2, K0 is a positive integer greater than or equal to 6*Mb, and K2 is a positive integer greater than or equal to 1 and less than or equal to 2*Mb.

The up-and-down adjacent pairs are a set constituted by two elements $\{hb_{ij}, hb_{((i+1)\ mod\ Mb)j}\}$ corresponding to non-zero square matrices in each basic matrix.

The up-and-down adjacent pairs of the first type are up-and-down adjacent pairs that are congruential with $(hb_{ij}-hb_{((i+1)\ mod\ Mb)j})$ mod Q=a.

The up-and-down adjacent pairs of the second type are up-and-down adjacent pairs that are congruential with $(hb_{ij}-hb_{((i+1)mod\ Mb)j})$ mod Q=b.

Herein, $hb_{ij}$ represents an element in the $i^{th}$ row and $j^{th}$ column of the basic matrix, herein, a and b are not equal, a and b are integers greater than or equal to 0 and less than or equal to Q−1, Q is a multiplication factor of an expansion factor z, a column weight of the $j^{th}$ column refers to the total number of elements corresponding to non-zero square matrice, in the $j^{th}$ column of the basic matrix, i is a row index of the basic matrix, j is a column index of the basic matrix, i=0, 1, . . . , Mb−1 j=0, 1, . . . , Nb−1.

If K2 is greater than or equal to 3, for any two adjacent rows (the $x1^{th}$ row and the $((x1+1)\ mod\ Mb)^{th}$ row), the number of adjacent pairs of the second type is at most 3. In this step, x1 takes the value from 0 to Mb−1.

The value of Q takes any of the following:
2, 3, 4, 5, 6, 7 and 8.

The total number of elements corresponding to the non-zero square matrices in the $j^{th}$ column of the basic matrix is 4, the first element from top to bottom is 0, $L_j$ is a positive integer greater than or equal to 1, and j=0, 1, . . . , Nb−1.

In step 902, according to the basic matrix and the corresponding expansion factor, an LDPC decoding operation of obtaining the information data of (Nb−Mb)×z bits according to the codeword of Nb×z bits is performed.

In this step, z is the expansion factor, and z is a positive integer greater than or equal to 1.

This step specifically includes the following.

1. By using a layered belief-propagation (BP) algorithm or a corrected min-sum algorithm, a row update is performed on the basic matrix, which includes:
    in an odd number iteration, in addition to updating extrinsic information corresponding to elements other than adjacent pairs of the second type, only extrinsic information corresponding to an element in each adjacent pair of the second type is updated,
    in an even number iteration, in addition to updating extrinsic information corresponding to elements other than adjacent pairs of the second type, only extrinsic information corresponding to another element in each adjacent pair of the second type is updated, and
    the extrinsic information is information from a check node to a variable node; and
2. a log-likelihood ratio for a codeword is calculated by using the extrinsic information, and a hard decision is performed, and whether the result is correct is checked, and if correct, then the correct codeword is output, and if wrong, then a processing of decoding is continued.

Embodiment 5

The embodiment of the present document provides an encoding device for structured LDPC codes, and the structure of the encoding device is shown in FIG. 10. The encoding device includes:
    a basic matrix storage module 1001, configured to determine a basic matrix used for encoding, which includes K0 up-and-down adjacent pairs. Herein, the basic matrix includes an Mb×(Nb−Mb) block A corresponding to systematic bits and an Mb×Mb block B corresponding to check bits. The basic matrix includes K1 up-and-down adjacent pairs of a first type and K2 up-and-down adjacent pairs of a second type, herein K0=K1+K2, K0 is a positive integer greater than or equal to 6*Mb, K2 is a positive integer greater than or equal to 0 and less than or equal to 2*Mb, the up-and-down adjacent pairs are a set constituted by two elements $\{hb_{ij}, hb_{((i+1) \mod Mb)j}\}$ corresponding to non-zero square matrices in each basic matrix, that is, a set constituted by two adjacent elements corresponding to non-zero square matrices in some column of the basic matrix, herein the last row and the first row are defined as adjacent rows, and the last row is defined as a previous row of the first row;

up-and-down adjacent pairs of the first type are up-and-down adjacent pairs that are congruential with $(hb_{ij} - hb_{((i+1) \mod Mb)j})$ mod Q=a;

up-and-down adjacent pairs of the second type are up-and-down adjacent pairs that are congruential with $(hb_{ij} - hb_{((i+1) \mod Mb)j})$ mod Q=b;

Herein, $hb_{ij}$ represents an element in the $i^{th}$ row and $j^{th}$ column of the basic matrix, herein, a and b are not equal, a and b are integers greater than or equal to 0 and less than or equal to Q−1, Q is a multiplication factor of an expansion factor z, a column weight of the $j^{th}$ column refers to the total number of elements corresponding to non-zero square matrices in the $j^{th}$ column of the basic matrix, i is a row index of the basic matrix, j is a column index of the basic matrix, i=0, 1, . . . , Mb−1, j=0, 1, . . . , Nb−1; and an encoding operation module 1002, configured to, according to the basic matrix and the expansion factor corresponding to the basic matrix, perform an LDPC encoding operation of obtaining a codeword of Nb×z bits according to source data of (Nb−Mb)×z bits, herein z is the expansion factor, and z is a positive integer greater than or equal to 1.

Preferably, if K2 is greater than or equal to 3, for any two adjacent rows (the x1$^{th}$ row and the ((x1+1) mod Mb)$^{th}$ row), the number of adjacent pairs of the second type is at most 3, herein row index x1 takes the value from 0 to Mb−1.

Preferably, the value of Q takes any of the following: 2, 3, 4, 5, 6, 7 and 8.

Preferably, the total number of elements corresponding to the non-zero square matrices in the $j^{th}$ column of the basic matrix is 4, the first element from top to bottom is 0, $L_j$ is a positive integer greater than or equal to 1, and j=0, 1, . . . , Nb−1.

Preferably, the value of K2 takes any of the following: 1, 2, 3, 4, 5, 6, 7, 8, 9, 10, 11 and 12.

The embodiment of the present document further provides a decoding device for structured LDPC codes, and the structure of the decoding device is shown in FIG. 11. The decoding device includes:

a basic matrix storage module 1101, configured to determine a basic matrix used for decoding, which includes K0 up-and-down adjacent pairs. Herein, the basic matrix includes an Mb×(Nb−Mb) block A corresponding to systematic bits and an Mb×Mb block B corresponding to check bits. The basic matrix includes K1 up-and-down adjacent pairs of a first type and K2 up-and-down adjacent pairs of a second type, herein K0=K1+K2, K0 is a positive integer greater than or equal to 6*Mb, and K2 is a positive integer greater than or equal to 1 and less than or equal to 2*Mb;

the up-and-down adjacent pairs are defined as a set constituted by two elements $\{hb_{ij}, hb_{((i+1) \mod Mb)j}\}$ corresponding to non-zero square matrices in each basic matrix, that is, a set constituted by two adjacent elements corresponding to non-zero square matrices in some column of the basic matrix, herein the last row and the first row are defined as adjacent rows, and the last row is defined as a previous row of the first row;

up-and-down adjacent pairs of the first type are up-and-down adjacent pairs that are congruential with $(hb_{ij} - hb_{((i+1) \mod Mb)j})$ mod Q=a;

up-and-down adjacent pairs of the second type are up-and-down adjacent pairs that are congruential with $(hb_{ij} - hb_{((i+1) \mod Mb)j})$ mod Q=b;

Herein, $hb_{ij}$ represents an element in the $i^{th}$ row and $j^{th}$ column of the basic matrix, herein, a and b are not equal, a and b are integers from 0 to Q−1, Q is a multiplication factor of an expansion factor z, a column weight of the $j^{th}$ column refers to the total number of elements corresponding to non-zero square matrices in the $j^{th}$ column of the basic matrix, i is a row index of the basic matrix, j is a column index of the basic matrix, i=0, 1, . . . , Mb−1, j=0, 1, . . . , Nb−1;

a decoding operation module 1102, configured to, according to the basic matrix and the corresponding expansion factor, perform an LDPC decoding operation of obtaining information data of (Nb−Mb)×z bits according to a codeword of Nb×z bits, herein, z is the expansion factor, and z is a positive integer greater than or equal to 1.

Preferably, if K2 is greater than or equal to 3, for any two adjacent rows (the x1$^{th}$ row and the ((x1+1) mod Mb)$^{th}$ row), the number of adjacent pairs of the second type is at most 3. Herein, the row index x1 takes the value from 0 to Mb−1.

Preferably, the value of Q takes any of the following: 2, 3, 4, 5, 6, 7 and 8.

Preferably, the total number of elements corresponding to the non-zero square matrices in the $j^{th}$ column of the basic matrix is 4, the first element from top to bottom is 0, $L_j$ is a positive integer greater than or equal to 1, and j=0, 1, . . . , Nb−1.

Preferably, the decoding operation module 1102 includes:

a row updating unit for the basic matrix 11021, configured to: use a layered BP algorithm and a corrected min-sum algorithm to perform a row update on the basic matrix, which includes:

in an odd number iteration, in addition to updating extrinsic information corresponding to elements other than adjacent pairs of the second type, only extrinsic information corresponding to an element in each adjacent pair of the second type is updated, in an even number iteration, in addition to updating extrinsic information corresponding to elements other than adjacent pairs of the second type, only extrinsic information corresponding to another element in each adjacent pair of the second type is updated, and the extrinsic information is information from check node to variable node; and a decoding decision unit 11022, configured to calculate a log-likelihood ratio for a codeword by using the extrinsic information, and perform a hard decision, and check whether the result is correct, and if correct, then output the correct codeword, and if wrong, then continue the processing of decoding.

Embodiments of the present document provide an encoding method, decoding method, encoding device and decoding device for structured LDPC codes. By determining a basic matrix used for decoding or encoding, which includes K0 up-and-down adjacent pairs, according to the basic matrix and the expansion factor corresponding to the basic matrix, the decoding or encoding is completed, LDPC encoding and decoding at the high pipeline speed are realized and the existing problem of low efficiency of a decoder/encode is solved. The matrix designed by the embodiment of the present document can revolutionarily improve efficiency of the decoder in combination with a specific decoding algorithm, which is significant for the development and application of ultra high-speed low complexity LDPC codes. The technical solutions provided by the embodiments of the present document can be applicable to an error-correcting coding technology for data transmission in a digital communication system to obtain LDPC codes whose efficiency is improved and whose complexity is reduced, and particularly applicable to an ultra high-speed scenario.

Those ordinarily people skilled in the art can understand that all or part of the steps of the above mentioned embodiments can be implemented by using a computer program process, and the computer program can be stored in a computer-readable storage medium and executed on an appropriate hardware platform (such as a system, equipment, apparatus, device and so on), and during the execution, one of the steps of the method embodiment or a combination thereof is included.

Alternatively, all or part of the steps of the above mentioned embodiments can also be implemented with integrated circuits, these steps can be made into individual integrated circuit modules respectively, or a plurality of the modules or steps can be made into a single integrated circuit module to be implemented. Therefore, the present document is not limited to any specific combination of hardware and software.

Each device/functional module/functional unit in the above mentioned embodiments may be implemented with universal computing devices, they can be concentrated on a single computing device or distributed on a network composed of a plurality of computing devices.

When each device/functional module/functional unit in the above mentioned embodiments is implemented in the form of software functional module, and is sold or used as an individual product, they may be stored in a computer readable storage medium. The above mentioned computer-readable storage medium may be a read-only memory, magnetic or optical disk, and the like.

Anyone familiar with the technical field of the art can easily conceive changes or replacements within the technical scope disclosed in the present document, and the changes or replacements shall fall within the protection scope of the present document. Therefore, the protection scope of the present document should be subject to the protection scope of the claims.

INDUSTRIAL APPLICABILITY

By using the decoding/encoding applicable to structured LDPC codes in embodiments of the present document, LDPC encoding and decoding at the high pipeline speed are realized.

We claim:

1. An encoder for structured low density parity check codes (LDPC) applied in wireless digital communication system, comprising:
    a memory, configured to store at least an Mb×Nb basic matrix used for encoding, wherein the basic matrix comprises an Mb×(Nb−Mb) block A corresponding to systematic bits and an Mb×Mb block B corresponding to check bits, the basic matrix comprises K0 up-and-down adjacent pairs, the K0 up-and-down adjacent pairs comprise K1 up-and-down adjacent pairs of a first type and K2 up-and-down adjacent pairs of a second type, wherein K0=K1+K2, K0 is a positive integer greater than or equal to 6*Mb, K2 is a positive integer greater than or equal to 0 and less than or equal to 2*Mb, the up-and-down adjacent pairs are a set constituted by two elements $\{hb_{ij}, hb_{((i+1)mod\ Mb)j}\}$ in the basic matrix corresponding to non-zero square matrices,
    up-and-down adjacent pairs of the first type are up-and-down adjacent pairs that are congruential with $(hb_{ij}-hb_{((i+1)mod\ Mb)j})$ mod Q=a, and
    up-and-down adjacent pairs of the second type are up-and-down adjacent pairs that are congruential with according to $(hb_{ij}-hb_{((i+1)mod\ Mb)j})$ mod Q=b,
    wherein $hb_{ij}$ represents an element in an $i^{th}$ row and $j^{th}$ column of the basic matrix, wherein a and b are not equal, a and b are integers greater than or equal to 0 and less than or equal to Q−1, Q is a multiplication factor of an expansion factor z, i is a row index of the basic matrix, j is a column index of the basic matrix, i=0, 1, . . . , Mb−1, j=0, 1, . . . , Nb−1; and
    a processor, configured to determine the basic matrix and the expansion factor z corresponding to the basic matrix, and perform an LDPC encoding operation of obtaining a codeword of Nb×z bits based on source data of (Nb−Mb)×z bits, wherein z is a positive integer greater than or equal to 1; wherein
    Q=2, a=0, b=1.

2. The encoder according to claim 1, wherein if K2 is greater than or equal to 3, for any $x1^{th}$ row and $((x1+1)\ mod\ Mb)^{th}$ row, a number of adjacent pairs of the second type is at most 3, wherein x1=0, 1, . . . , Mb−1.

3. The encoder according to claim 1, wherein a total number of elements in a $j^{th}$ column of the basic matrix corresponding to non-zero square matrices is Lj, a first element from top to bottom is 0, Lj is a positive integer greater than or equal to 1, and j=0, 1, . . . , Nb−1.

4. The encoder according to claim 1, wherein a value of K2 takes any one of the following: 1, 2, 3, 4, 5, 6, 7, 8, 9, 10, 11 and 12.

5. A decoder for structured low density parity check codes (LDPC) applied in wireless digital communication system, comprising:
    a memory, configured to store at least an Mb×Nb basic matrix used for decoding, wherein the basic matrix comprises an Mb×(Nb−Mb) block A corresponding to systematic bits and an Mb×Mb block B corresponding to check bits, the basic matrix comprises K0 up-and-down adjacent pairs, the K0 up-and-down adjacent pairs comprise K1 up-and-down adjacent pairs of a first type and K2 up-and-down adjacent pairs of a second type, wherein K0=K1+K2, K0 is a positive integer greater than or equal to 6*Mb, K2 is a positive integer greater than or equal to 0 and less than or equal to 2*Mb, the up-and-down adjacent pairs are a set constituted by two elements $\{hb_{ij}, hb_{((i+1)mod\ Mb)j}\}$ in the basic matrix corresponding to non-zero square matrices,
    up-and-down adjacent pairs of the first type are up-and-down adjacent pairs that are congruential with $(hb_{ij}-hb_{((i+1)mod\ Mb)j})$ mod Q=a, and
    up-and-down adjacent pairs of the second type are up-and-down adjacent pairs that are congruential with $(hb_{ij}-hb_{((i+1)mod\ Mb)j})$ mod Q=b, wherein $hb_{ij}$ represents an element in an $i^{th}$ row and $j^{th}$ column of the basic matrix, wherein a and b are not equal, a and b are integers greater than or equal to 0 and less than or equal to Q−1, Q is a multiplication factor of an expansion factor z, i is a row index of the basic matrix, j is a column index of the basic matrix, i=0, 1, . . . , Mb−1, j=0, 1, . . . , Nb−1; and a processor, configured to determine the basic matrix and a corresponding expansion factor z, and perform an LDPC decoding operation of obtaining information data of (Nb−Mb)×z bits based on a codeword of Nb×z bits, wherein z is a positive integer greater than or equal to 1; wherein Q=2, a=0, b=1.

6. The decoder of claim 5, wherein if K2 is greater than or equal to 3, for any $x1^{th}$ row and $((x1+1) \bmod Mb)^{th}$ row, a number of adjacent pairs of the second type is at most 3, wherein x1=0, 1, . . . , Mb−1.

7. The decoder of claim 5, wherein, the processor comprises hardware performing instructions stored in a non-transitory computer readable medium which executes steps in following units:

a row updating unit for the basic matrix, configured to:
use a layered belief-propagation (BP) algorithm and a corrected min-sum algorithm to perform a row update on the basic matrix, which comprises:

in an odd number iteration, in addition to updating extrinsic information corresponding to elements other than adjacent pairs of the second type, only updating extrinsic information corresponding to an element in each adjacent pair of the second type, in an even number iteration, in addition to updating extrinsic information corresponding to elements other than adjacent pairs of the second type, only updating extrinsic information corresponding to another element in each adjacent pair of the second type, wherein the extrinsic information is from a check node to a variable node; and a decoding decision unit, configured to calculate a log-likelihood ratio for a codeword by using the extrinsic information, and perform a hard decision, and check whether a result is correct, and if correct, then output a correct codeword, and if wrong, then continue a processing of decoding.

8. The decoder according to claim 5, wherein a total number of elements in a $j^{th}$ column of the basic matrix corresponding to non-zero square matrices is Lj, a first element from top to bottom is 0, Lj is a positive integer greater than or equal to 1, and j=0, 1, . . . , Nb −1.

9. A decoder for structured low density parity check codes (LDPC) applied in wireless digital communication system, comprising hardware performing instructions stored in a non-transitory computer readable medium which executes steps in following modules:

a basic matrix storage module, configured to store at least an Mb×Nb basic matrix used for decoding, wherein the basic matrix comprises an Mb×(Nb−Mb) block A corresponding to systematic bits and an Mb×Mb block B corresponding to check bits, the basic matrix comprises K0 up-and-down adjacent pairs, the K0 up-and-down adjacent pairs comprise K1 up-and-down adjacent pairs of a first type and K2 up-and-down adjacent pairs of a second type, wherein K0=K1+K2, K0 is a positive integer greater than or equal to 6*Mb, K2 is a positive integer greater than or equal to 0 and less than or equal to 2*Mb, the up-and-down adjacent pairs are a set constituted by two elements $\{hb_{ij}, hb_{((i+1) \bmod Mb)j}\}$ in the basic matrix corresponding to non-zero square matrices, up-and-down adjacent pairs of the first type are up-and-down adjacent pairs that are congruential with $(hb_{ij} - hb_{((i+1) \bmod Mb)j}) \bmod Q = a$, and up-and-down adjacent pairs of the second type are up-and-down adjacent pairs that are congruential with $(hb_{ij} - hb_{((i+1) \bmod Mb)j}) \bmod Q = b$, wherein $hb_{ij}$ represents an element in an $i^{th}$ row and $j^{th}$ column of the basic matrix, wherein a and b are not equal, a and b are integers greater than or equal to 0 and less than or equal to Q−1, Q is a multiplication factor of an expansion factor z, i is a row index of the basic matrix, j is a column index of the basic matrix, i=0, 1, . . . , Mb−1, j=0, 1, . . . , Nb−1; and a decoding operation module, configured to determine the basic matrix and a corresponding expansion factor z, and perform an LDPC decoding operation of obtaining information data of (Nb−Mb)×z bits based on a codeword of Nb×z bits, wherein z is a positive integer greater than or equal to 1; wherein Q=2, a=0, b=1.

* * * * *